United States Patent [19]

Baliga

[11] Patent Number: 4,969,028
[45] Date of Patent: Nov. 6, 1990

[54] GATE ENHANCED RECTIFIER

[75] Inventor: Bantval J. Baliga, Clifton Park, N.Y.

[73] Assignee: General Electric Company, Schenectady, N.Y.

[21] Appl. No.: 492,377

[22] Filed: Mar. 8, 1990

Related U.S. Application Data

[63] Continuation of Ser. No. 165,439, Feb. 29, 1988, abandoned, which is a continuation of Ser. No. 816,918, Jan. 8, 1986, abandoned, which is a continuation of Ser. No. 483,009, Apr. 7, 1983, abandoned, Continuation of Ser. No. 212,181, Dec. 2, 1980.

[51] Int. Cl.⁵ .................. H01L 29/74; H01L 29/10; H01L 29/68; H01L 27/02
[52] U.S. Cl. .................. 357/38; 357/23.3; 357/23.4; 357/23.8; 357/43
[58] Field of Search .................. 357/23.3, 23.4, 23.8, 357/38, 43

[56] References Cited

U.S. PATENT DOCUMENTS

| | | | |
|---|---|---|---|
| 4,300,152 | 11/1981 | Lepselter | 357/15 |
| 4,324,038 | 4/1982 | Chang et al. | 357/23 |
| 4,364,073 | 12/1982 | Becke et al. | 357/23.4 |
| 4,376,286 | 3/1983 | Lidow et al. | 357/23.4 |
| 4,639,758 | 1/1987 | Iizuka | 357/23.7 |

OTHER PUBLICATIONS

Hofstein, S. R. et al., "The Insulated Gate Tunnel Junction Triode", *IEEE Transactions on Electron Devices*, pp. 66–76, Feb. 1965.

Primary Examiner—Rolf Hille
Assistant Examiner—Wael Fahmy
Attorney, Agent, or Firm—Robert Ochis; James C. Davis, Jr.; Marvin Synder

[57] ABSTRACT

A high power semiconductor rectifier is constructed so that the rectifier is normally off and can be switched on by applying a bias signal to a gate of a metal-insulator-semiconductor structure monolithically integrated with the rectifier in such a manner as to induce a conducting channel between the anode and cathode of the rectifier. The device has both forward and reverse blocking capability and a low forward voltage drop when in the conducting state. The device has a very high turn-off gain and both high dV/dt and di/dt capabilities.

30 Claims, 6 Drawing Sheets

GATE ENHANCED RECTIFIER

This application is a file wrapper continuation of Application Ser. No. 165,439, filed Feb. 29, 1988 which is a continuation of Application Ser. No. 816,918 filed Jan. 8, 1986 which is a continuation of Application Ser. No. 483,009 filed Apr. 7, 1983 which in turn is a continuation of Application Ser. No. 212,181 filed Dec. 2, 1980.

BACKGROUND OF THE INVENTION

This invention relates to power field effect semiconductor devices, and more particularly, to field controlled semiconductor rectifiers having a field effect control structure monolithically integrated with the rectifier structure.

Figure 1:
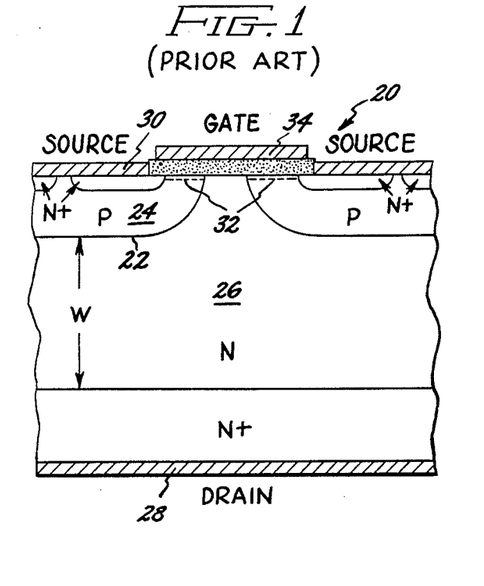
FIGS. 1 and 2 are schematic partial cross-sectional views of power MOS gated field effect transistors.
Figure 2:
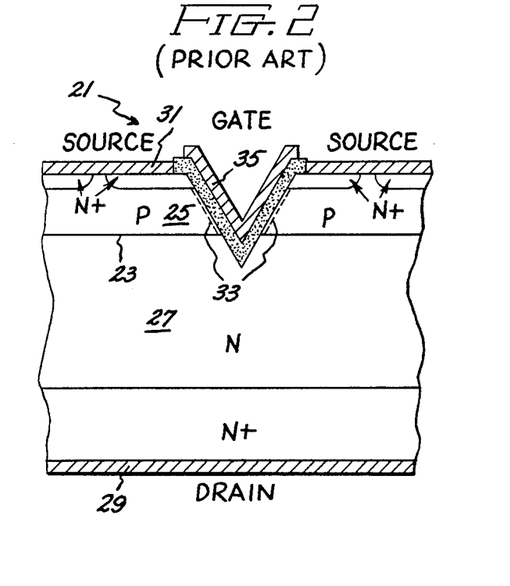
Figure 3:
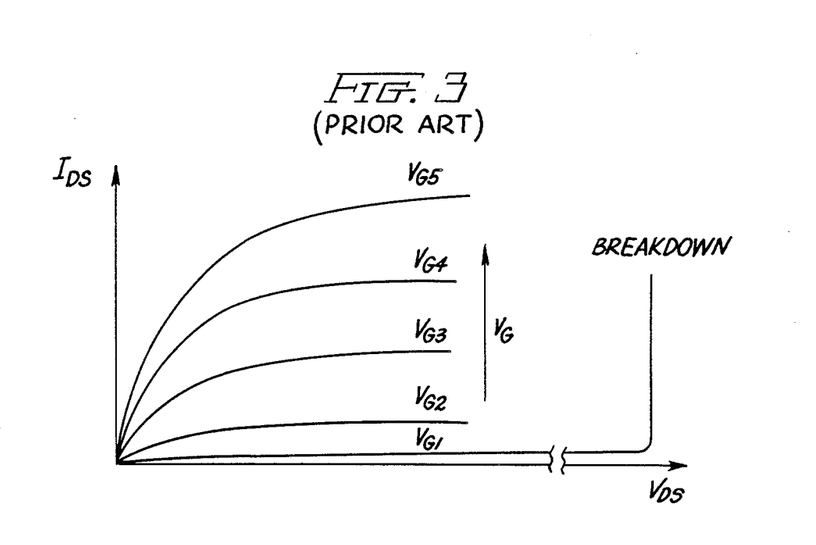
FIG. 3 is a graphical illustration of the device characteristics of the transistors shown schematically in FIGS. 1 and 2.

For power switching applications, in such electrical systems as motor drives and low to medium frequency (0-2000 Hz) power supplies, high speed and low loss performance at high current and high voltage levels is desirable. Prior art three terminal devices which can be used to control power delivered to a load include the MOSFET and the MOS gated thyristor. Prior art power MOSFET's include those described in U.S. Pat. No. 4,072,975, issued Feb. 7, 1978 to Ishitani and U.S. Pat. No. 4,145,703, issued Mar. 20, 1979 to Blanchard. Typical cross sections of power MOSFET devices are shown schematically in FIGS. 1 and 2 and their operating characteristics are shown in FIG. 3. These devices have been fabricated by using either planar diffusion techniques to form a DMOS structure 20 as shown in FIG. 1, or by etching V-grooves to form a VMOS structure 21 as shown in FIG. 2. In each case, for positive voltages applied to the drain, the junctions 22, 23 between the P-base regions 24, 25 and the N-drift regions 26 27 in FIGS. 1 and 2, respectively, block current flow between the drains 28, 29 and the sources 30, 31 in the absence of gate biases. Application of a sufficiently large positive gate bias with reference to the source results in the formation of an n-type inversion layer 32, 33 in the respective p-base regions under the gate electrodes 34, 35, respectively. This inversion layer allows conduction of electrical current from the drain to the source producing the forward conduction characteristics shown in FIG. 3. Increasing the gate bias, e.g., from $V_{G1}$ through $V_{G5}$, increases the conductivity of the inversion layer and thus allows higher drain current $I_{Ds}$ to flow. For negative voltages applied to the drain, the device conducts current like a forward biased p-n junction diode and cannot block current flow. As a result, these devices are operated with only positive voltages applied to the drain.

In MOSFET devices, only majority carrier (electron) current flow occurs between drain and source. This current flow is consequently limited by the majority carrier (electrons here) concentration in the channel and drift regions which determines their resistivity. For devices designed for operation at greater than 100 volts, the resistance of the drift region becomes large because the majority carrier concentration in the drift region must be small and the drift region width (W) must be large in order to support the device blocking voltages. Due to the high drift region resistance, high voltage MOSFET devices must be operated at low current densities to obtain low forward voltage drops. A typical current density of operation is about 50 A/cm$^2$ at a forward voltage drop of 1.5 volts for a device capable of blocking up to 600 volts.

Despite this drawback of a high on-resistance, power MOSFET's have the advantage of requiring lower gate drive power levels than bipolar transistors since the gate voltage signal is applied across an insulating film. In these devices the drain current can also be turned off by bringing the gate voltage down to the source potential. This gate turn-off can be achieved with a higher current gain than for bipolar transistors.

Figure 5:
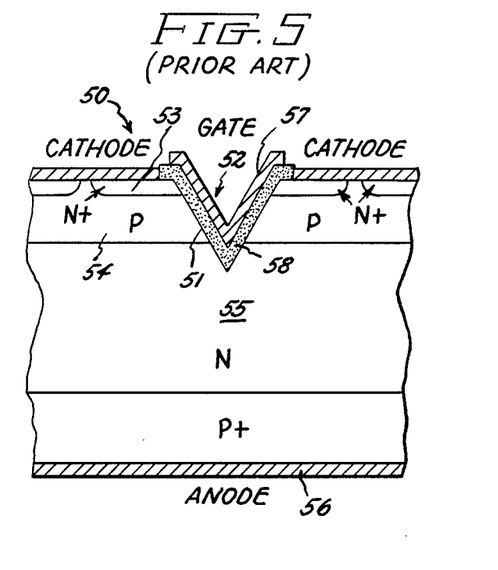
Figure 6:
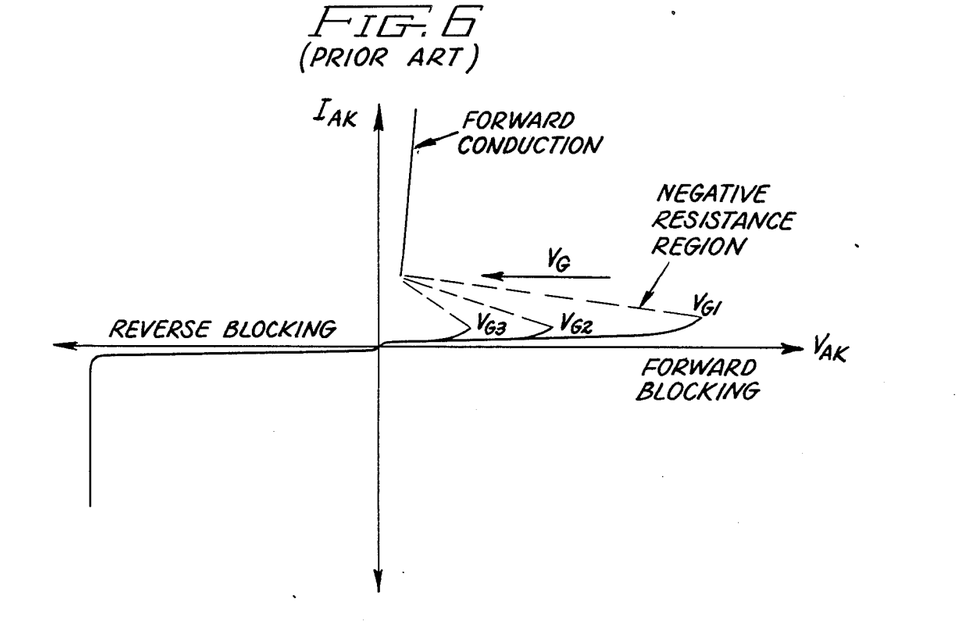
FIG. 6 is a graphical illustration of typical device characteristics of the thyristors illustrated in FIGS. 4 and 5.

Another type of prior art device is the MOS gated thyristor. Typical devices are disclosed in British Pat. No. 1,356,670, published June 12, 1974, U.S. Pat. No. 3,753,055, issued Aug. 14, 1973 to Yamashita et al., and U.S. Pat. No. 3,831,187, issued Aug. 20, 1974 to Neilson. A MOS gated thyristor is a pnpn thyristor structure, shown schematically in FIGS. 4 and 5, in which regenerative turn-on can be initiated by application of a voltage to an MOS gate. In the device 40 of FIG. 4, the MOS gate is formed on a surface 41 extending from the N+cathode 42 through the P-base 43 into a small portion of the N-base 44. In the device 50 of FIG. 5, the MOS gate is formed on a surface 51 extending along V-groove 52 from the N+cathode 53 through the P-base layer 54 into N-base 55. These devices will block current flow with either positive or negative voltages applied to their respective anodes 45, 56 in the absence of the gate bias. However, for positive anode voltages, the devices can be triggered into the conducting mode by application of a suitable positive voltage on the respective gates 46, 57. When a positive gate voltage is applied, the electric field across the gate oxide layers 47, 58 produces a depletion of carriers in the p-base under the gate electrode. As a result, the depletion layer in the p-base extends closer to the N+cathode region under the gate. This reduces the thickness of the undepleted p-base region of the upper NPN transistor under the gate electrode and thus increases its current gain. It is well known that a pnpn thyristor structure will switch from a current blocking state to a current conducting state when the sum of the current gains of the NPN and PNP transistors, $\alpha_{NPN}$ and $\alpha_{PNP}$, respectively, exceeds unity. In the MOS gated thyristor, resistor increases until $\alpha_{NPN} + \alpha_{PNP}$ exceeds unity. At this point strong injection of carriers must occur from the N+cathode into the p-base for the device to switch to the on-state. This requires that the N+P junction become forward biased by more than 0.5 volts. Once this takes place, the device switches to the conducting state and removal of the gate bias voltage will not cause the device to return to the blocking state because of the self-sustaining regenerative action inherent in the pnpn thyristor structure. Thus, these devices have the advantage of requiring low gate power to turn-on the thyristor via the MOS gate, but do not exhibit gate turn-off capability. Thus, the device must be returned to the blocking state by reversal of the anode polarity. The characteristics of the MOS gated thyristor are shown in FIG. 6, which show that these devices exhibit a negative resistance characteristic.

SUMMARY OF THE INVENTION

An object of the instant invention is to provide a field effect controlled, high current capacity rectifier that has both forward and reverse blocking capabilities and a low forward voltage drop, which can be switched on and off with a small gate voltage with very low current, and therefore, low power requirement. A further object is to provide a device which will have a very high gate turnoff gain, high di/dt capability, and high dV/dt capability. Further objects include providing a device which will operate at elevated temperature and radiation levels without damage.

Accordingly, the instant invention incorporates a monolithically integrated combination of a rectifier with a field effect control structure to control the on-off state of the rectifier by inducing a channel of conductivity within a region of the rectifier to control the on-off condition of pn junctions within the rectifier. The rectifier includes a multiple layer structure within a body of semiconductor material having one contact on one surface of the body and another contact on another surface of the body. The field effect control structure induces a channel of conductivity through one element of the rectifier to provide an electrically conductive path connecting one of the contacts with a second element of the rectifier.

BRIEF DESCRIPTION OF THE DRAWINGS

The features of the invention believed to be novel and unobvious over the prior art are set forth with particularity in the appended claims. The invention itself, however, as to organization, method of operation and advantages thereof, may best be understood by reference to the following description taken in conjunction with the accompanying drawings, in which like reference characters refer to like elements throughout, and in which:

DESCRIPTION OF THE PREFERRED EMBODIMENTS

Figure 7:
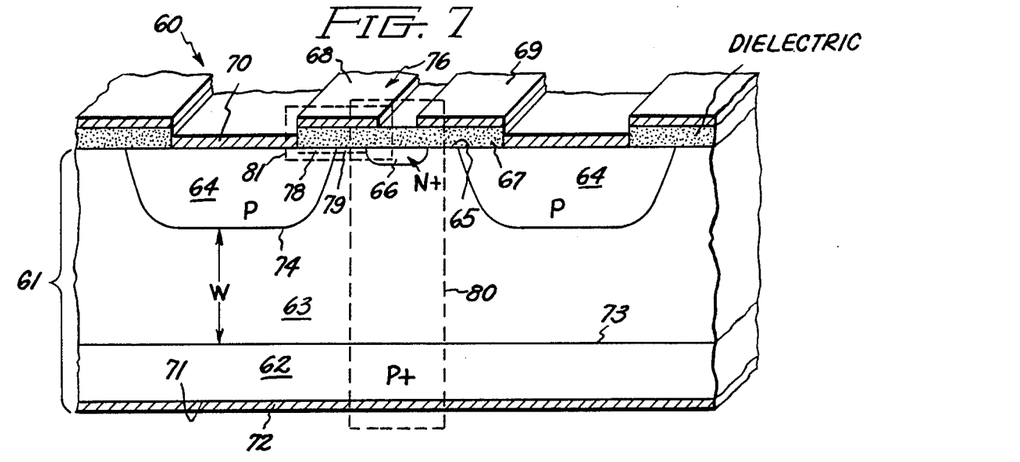
FIG. 7 is a pictorial schematic partial cross-sectional view of a gate controlled rectifier according to the instant invention.

One form of the basic device structure of the instant invention is illustrated in FIG. 7. The device 60 includes a body 61 of semiconductor material, such as silicon, in which a first layer 62 of one type conductivity, P in FIG. 7, and a base region 63 of opposite conductivity, N in FIG. 7, is included. A first layer 62 can be made by diffusion into a body to produce the anode-base structure of the device, or a body of the conductivity type desired may have a layer grown epitaxially thereover to produce the two-layer combination. A plurality of islands 64, here of P type conductivity, is provided by diffusion or other suitable technique within layer 63 in spaced relationship contiguous with the free surface 65 of the body 61. Adjacent island 64, an N+island 66 is formed within the base layer 63. Typical doping levels for the N type layer 63 are in the range of $10^{13}$ to $10^{16}$ cm$^{-3}$ of N type carriers; for the P type anode layer 62 typical doping concentrations are in the range of to $10^{18}$ to $10^{20}$ cm$^{-3}$ of P type carriers; for the P type islands 64 typical doping concentrations are $10^{16}$ to $10^{18}$ cm$^{-3}$; and for the N+islands 66 typical doping concentrations are to $10^{18}$ to $10^{20}$ cm$^{-3}$. A layer 67 of dielectric material is formed over a portion of free surface 65 including part of the outer surface of adjacent ones of the islands 64 and the region of base layer 63 separating the adjacent islands 64 including island 66. A contact 68, 69 of conductive material, such as aluminum or conductive polycrystalline silicon, is formed over the dielectric layer 67 each overlapping a part of an island 64 and a part of the base layer 63 adjacent the island 64 to serve as a gate electrode. A layer 70 of conductive material such as aluminum or conductive polycrystalline silicon is deposited over the center of each of the islands 64 to form an ohmic contact thereto. On the surface 71 of the body 61 a layer 72 of conductive material, such as aluminum or conductive polycrystalline silicon, is deposited to form an ohmic contact to the layer 62. Although stripes are shown for the upper surface pattern of the conductive contacts 68, 69 and 70 in FIG. 7, it will be appreciated by those skilled in the art that many repetitive geometric contact patterns, such as small contact pads arranged on the surface in closely spaced relationship, could be used. The device is highly interdigitated, e.g., the width of individual stripes is small and the total number of stripes large. The pattern is repeated in the lateral direction to cover the entire semiconductor device. Each of the conductive contacts extends to one lateral edge of the device, where the contacts 68, 69 are connected to a source of electrical potential, contacts 70 are connected to a source of electrical potential of a polarity different from that of the source connected to contacts 68, 69 and contact 72 is connected to a source of electrical potential of a polarity different from that of the source connected to contacts 70.

The device shown in FIG. 7 exhibits the operating characteristics shown in FIG. 14 and operates as follows. With the contact 70 at ground potential, and no bias supplied to the gate electrode 68, negative voltages applied to the contact 72 result in no current flow because the junction 73 is reversed biased. This provides reverse blocking capability. With no bias supplied to the gate electrode 68, positive voltages supplied to the contact 72 will again result in no current flow because the junction 74 will be reversed biased. This provides the forward blocking capability as well as a desired normally off device characteristic. However, if a positive bias is applied to the gate electrode 68, an inversion layer extending from the ohmic contact 70 to the N-base 63 can be formed under the gate in the p-base in the region 78 of island 64 immediately beneath the insulating layer 67, and an N accumulation layer of charge carriers can be formed in the region 79 of the N base 63. The N-type inversion layer now in region 78 of P island 64 and the accumulation layer in the region 79 of the N base now connect the ohmic contact 70 to the N+island 66 in the middle of the device. A positive bias applied to the contact 72 will now result in current flow from the P+layer 62 functioning as an anode to the N+island 66 and then via the N-type accumulation layer 79 and the N-type inversion layer 78 to the contact 70 functioning as a cathode. The path from the layer 62 to the N+island 66 functions analogously to a p-i-n diode, shown at 80 in FIG. 7, and the field effect control region is outlined at 81. The conductivity of the current path through the N-base 63 between the P+layer 62 and the N+island 66 will be modulated (increased) by the current flow due to injection of a high concentration of minority carriers (holes here) into the N-base 63 from the layer 62. Since the voltage is supported across the N base 63 in the forward and reverse blocking modes, the width W of the path between the P+layer 62 and the P island 64 determines the maximum blocking voltages. For high voltage performance this width must be increased. The conductivity modulation flow is consequently very important for achieving a low forward voltage drop at high forward current densities in high voltage devices. A typical forward current density of operation is about 500 A/cm$^2$ at a forward voltage, drop of 1.5 volts for a device capable of blocking up to 600 volts. If all the conductivity types are reversed, similar performance characteristics can be obtained with electrical potentials of opposite polarities applied to the conductive contacts.

Figure 8:
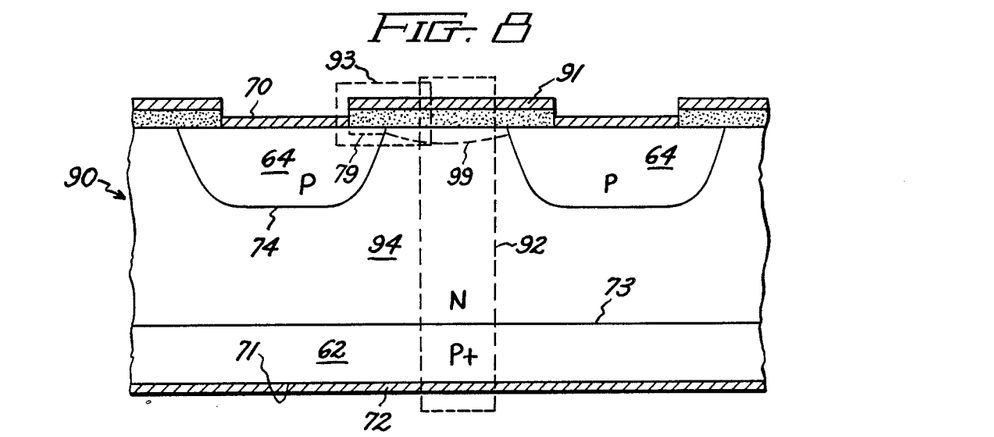
FIGS. 8-13 are schematic partial cross-sectional views of alternate embodiments of the gate controlled rectifier according to the instant invention.

An alternative embodiment of the gate controlled rectifier of the instant invention is shown schematically in FIG. 8. The device 90 of FIG. 8 differs from that of FIG. 7 in omitting N+island 66. The elimination of the island 66 requires that adequate potential be applied to gate contact 91 to create an accumulation layer 99 under dielectric layer 67 to produce a region of N type carriers below the gate. To accomplish this with the lowest spreading resistance in the path of current flow beneath the gate requires that a gate contact 91 extend across the entire width of the gate region connecting the adjacent islands 64. A contact of lesser width would create the necessary accumulation layer 99 of N carriers beneath the gate to provide the function of the N+islands 66, when adequate potential is applied to the gate. This decrease in the area of the gate will result in a decrease in the gate capacitance. When a positive bias is applied to the gate of the field effect control structure outlined at 93, a three layer structure is formed in the region outlined by dashed rectangle 92 which functions as a p-i-n structure. The current path through the rectifier includes the layer 62, n base region 94, n accumulation layer 99, an inversion layer 79 and ohmic contact 70.

Figure 9:
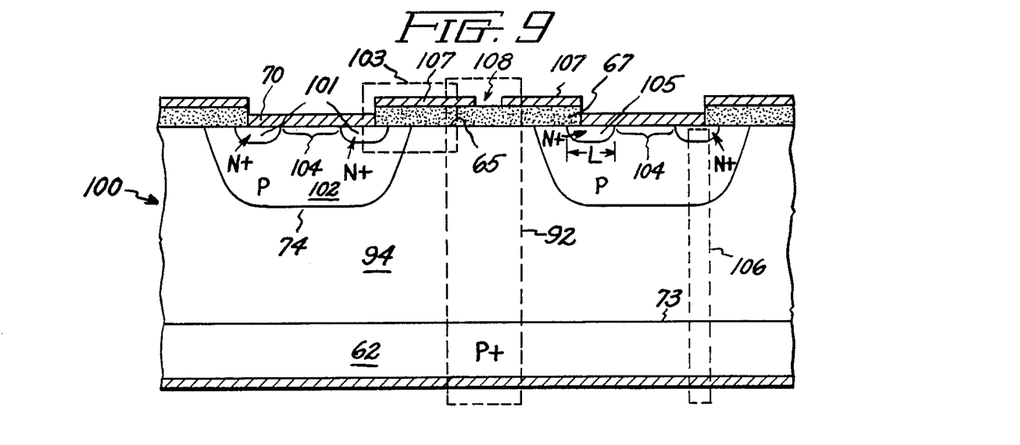

A further alternative embodiment of my invention is schematically illustrated in FIG 9. The device 100 includes P region 62, base region 94, P islands 102 and a plurality of N+islands 101 within each of the P islands 102. In this embodiment, the islands 101 provide a contact between the inversion layer in the islands 102 and the conductive contact 70. A pair of conductive contacts 107 separated by gap 108 is disposed on dielectric layer 67 to overlap a portion of the islands 101, a region of the islands 102 and a portion of the base 94. Application of a positive gate bias to a control electrode 107 within dashed outline 103 will produce an accumulation layer in the N base region immediately under the gate, and an inversion layer in the P island 102 immediately under the dielectric layer 67 extending from the N+island 101 to the N-base 94 completing the current path from the N base through the P island 102 to the N+island 101. This structure includes a parasitic p-n-p-n thyristor through the anode 62, base 94, P island 102 and n+islands 101 in the region outlined at 106. To achieve the desired device performance of this device in switching off upon removal of the gate bias, it is very important that the regenerative turn-on mechanism in this parasitic thyristor be suppressed.

This can be accomplished by preventing the N+islands 101 from injecting electrons into the respective P islands 102, consequently preventing the initiation of the regenerative turn-on mechanism of the p-n-p-n thyristor. The suppression of the injection of carriers from the N+islands 101 can be accomplished by forming the N+islands 101 with a small lateral dimension (L). The lateral dimension (L) of the N+islands 101 must be small enough so that, when the device is conducting current from the channel 78 to the cathode contact 70, the forward bias of the junction 105 between the N+islands 101 and the P-island 102 does not exceed 0.5 volts. Another technique which could be used to suppress the regenerative turn-on of the p-n-p-n thyristor is the introduction of recombination centers in the p-region 102 and the N-base 94 so as to reduce the gains $a_{NPN}$ and $a_{PNP}$. Recombination centers can be provided by diffusion of deep level impurities, such as gold, into the substrate or by irradiation of the substrate with high energy particles such as electrons.

Figure 4:
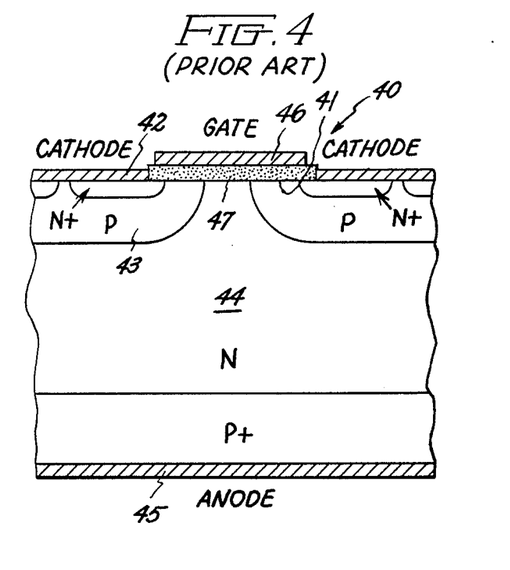
FIGS. 4 and 5 are schematic partial cross-sectional views of MOS gated thyristors.

Distinguishing features between an MOS gated thyristor, such as that shown in FIG. 4, and the device of this invention, shown in FIG. 9, are firstly, that the device of this invention contains N+regions 101 of much smaller lateral dimension (L) to prevent the regenerative turn-on action characteristic of the MOS gated thyristor. Secondly, in the gate enhanced rectifier, the anode current flows solely via the conductive channel formed in the P-island 102 to the cathode contact 70 when the device is conducting current, while the current of the MOS gated thyristor flows vertically throughout the P-island 102 underneath the N+island 101. Thirdly, in the gate enhanced rectifier, the anode current can be terminated by removal of the gate voltage applied to induce the conducting channel in the P-islands 102, while the anode current of the MOS gated thyristor will continue to flow after removal of the gate voltage due to the self-sustaining nature of the regenerative pnpn thyristor action. It is noted that the embodiment in FIG. 8 avoids this problem by elimination of the N+islands within the P islands 102.

Figure 10:
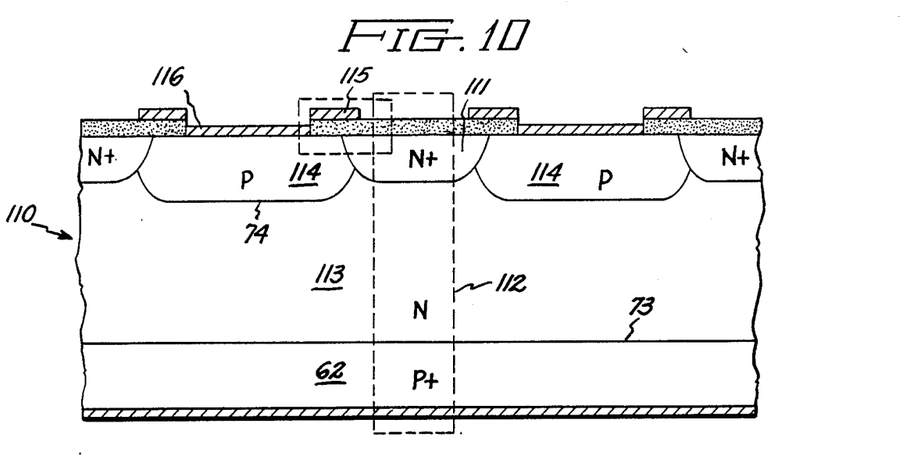

In the alternative embodiment shown in FIG. 10, N+island 111 filling the entire width between adjacent P islands 114 and the N base 113 and impinging upon a portion of the P islands is formed in the N base. When a positive bias is applied to the gate 115 an inversion layer is created in the region of the P islands immediately under the gate and the current path from the N+island 111 to the cathode contact 116 is completed, thereby turning the device on and allowing current to flow through the p-i-n diode outlined at 112 and via the inversion layer to the cathode contact 116.

Figure 11:
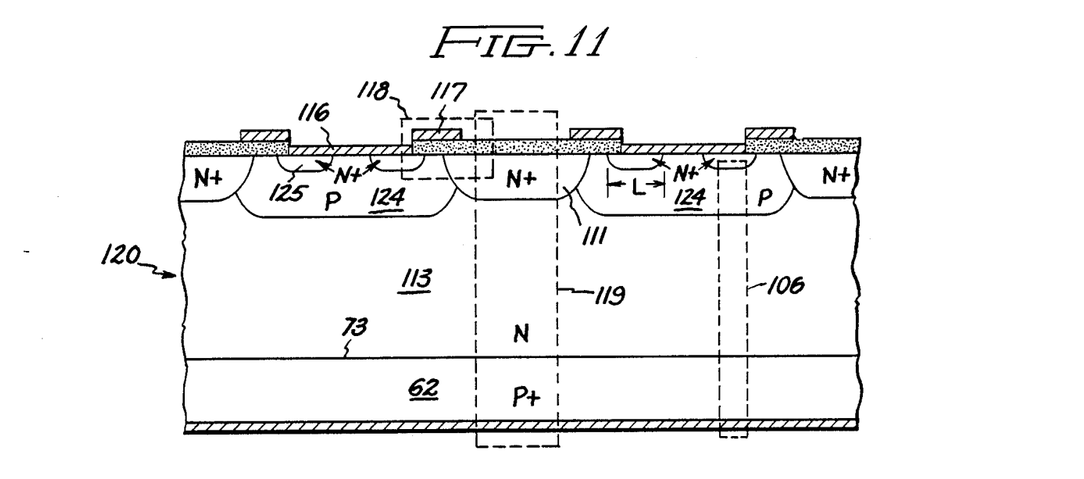

In the embodiment shown in FIG. 11, N+islands 125 have been added to the P islands 124 of the device 120 which provide current flow paths from the inversion layer in P-islands 124 to the conductive contact 116, when a positive bias is applied to electrode 117 in gate structure 118 to turn on the p-i-n diode 119. This embodiment also contains the parasitic pnpn thyristor described with reference to the embodiment shown in FIG. 9. As discussed earlier with reference to FIG. 9, the regenerative turn-on mechanism of this parasitic thyristor must be suppressed by maintaining a small lateral dimension (L) for the N+island 125 and by providing recombination centers in the P-islands 124 and the N-base 113. It is noted that the embodiment of FIG. 10 avoids this problem by elimination of the n+islands within the p islands 102.

Figure 12:
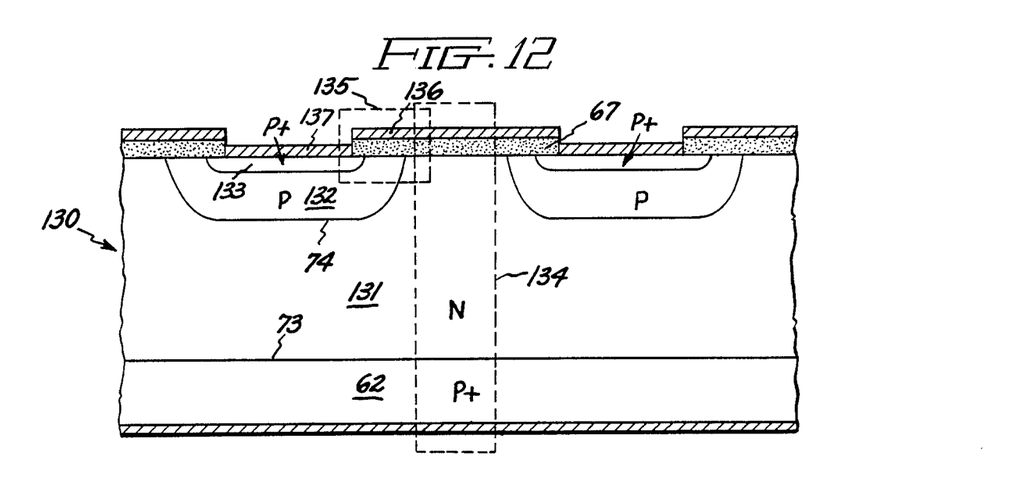

In device 130 shown schematically in FIG. 12, highly doped P+islands 133 have been added to the P islands 132 in the N base 131. The current path includes the p-i-n diode 134 created when a positive bias relative to the conductive contact 137 is applied to the gate 136 in the gate controlled structure 135 to produce an accumulation layer immediately under the dielectric layer 67. An inversion layer is produced in P island 132 between the P+island 133 and the N-base 131 to allow current flow from the anode to the cathode.

Figure 13:
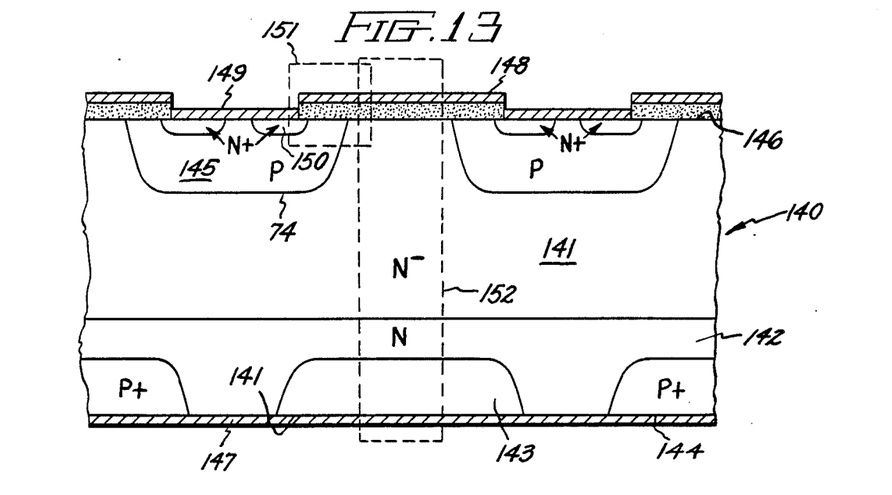

A further alternative device structure employing my invention is shown schematically in FIG. 13. The body of semiconductor material for device 140 has a lightly doped N-base region 141 and a more heavily doped N-base region 142. Within base region 142 P+islands 143 are formed adjacent to one major free surface 144 of the body. P islands 145 are formed into the N-region 141 and the N+islands 150 are formed into the P islands 145 adjacent the other major surface 146 of the body. For a given forward conduction current density this structure provides a lower forward voltage drop in the diode 152 than the previously described embodiments for the same forward blocking capability. However, the reverse blocking capability is reduced due to the shorting of the islands 143 by conductive contact 147. The operating characteristics of this device are similar to those of the other embodiments when a forward bias is applied. When a reverse bias is applied to the conductive contact 147 in the absence of a bias on gate electrode 148 in gate controlled structure 151, a substantially different characteristic is produced as shown at 160 in FIG. 14, in that breakdown occurs at a much lower reverse bias.

Figure 14:
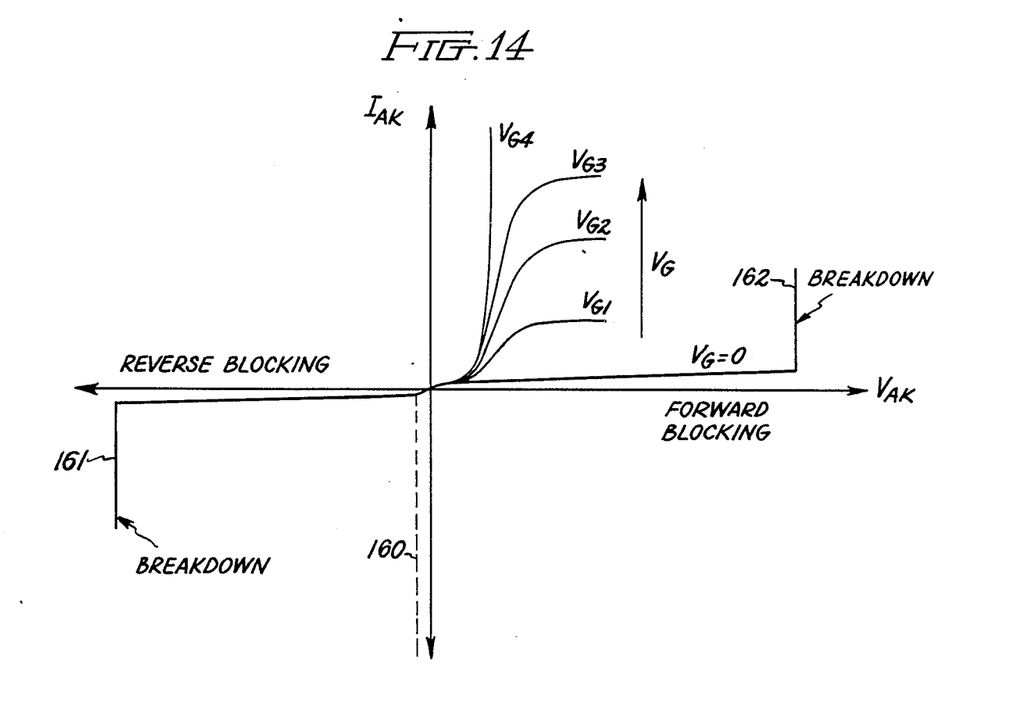
FIG. 14 is a graphical representation of the device characteristics of the gate controlled rectifier of the instant invention.

The operating characteristics of the gate controlled rectifier are shown in FIG. 14. In this device, the junction 73 blocks current flow when negative voltages are applied to the anode contact 72 providing the device with reverse blocking capability up to the level at which breakdown occurs as seen at 161. When positive voltages are applied to the anode contact 72, junction 74 becomes reverse biased and blocks current flow, thus providing the forward blocking capability in the absence of gate bias up to the level at which breakdown occurs as seen at 162. However, if a positive bias is applied to the gate, a path is created for the current to flow from the anode junction 73 to the cathode contact 70 producing the characteristics shown for each of the gate voltage $V_{G1}$-$V_{G4}$ At large gate voltages ($V_{G4}$) the inversion layer conductivity will be high and the device will exhibit characteristics like those of a pn junction diode. In this case the anode P+region injects minority carriers into the n-base and strongly modulates (increases) the conductivity of the n-base. As a result of this, the device can be operated at high current densities (typically 500 A/cm$^2$) with a low forward voltage drop (about 1.5 volts). At lower gate voltages ($V_{G1}$, $V_{G2}$, $V_{G3}$) the current flow can become limited by the conductivity of the inversion layer producing the current saturation shown in FIG. 14. These device characteristics are distinguishable from those of other prior art devices. When compared with the MOSFET, the gate enhanced rectifier can be operated at much higher current densities due to the modulation of the conductivity of the N-base by the anode current flow. Unlike the MOSFET, these devices also exhibit reverse blocking capability. When compared with the MOS gated thyristor, the gate enhanced rectifier is distinguished by the absence of a negative resistance region in the forward characteristics. This negative resistance region in the thyristor arises from the regenerative turn-on phenomenon which is absent in the gate enhanced rectifier.

Unlike the MOS gated thyristor, no self-sustaining regenerative turn-on occurs in the gate enhanced rectifier device. Consequently, if the gate voltage is reduced to the cathode potential while the device is conducting current, the inversion layer under the gate electrode will cease to exist and the anode current will turn off. This turn-off occurs in two stages. First, most of the injected stored charge in the N-base is removed by current flow across the junction 74 to P region 145 until it becomes reverse biased. After this point the rest of the minority carrier stored charge will decay by recombination.

Figure 15:
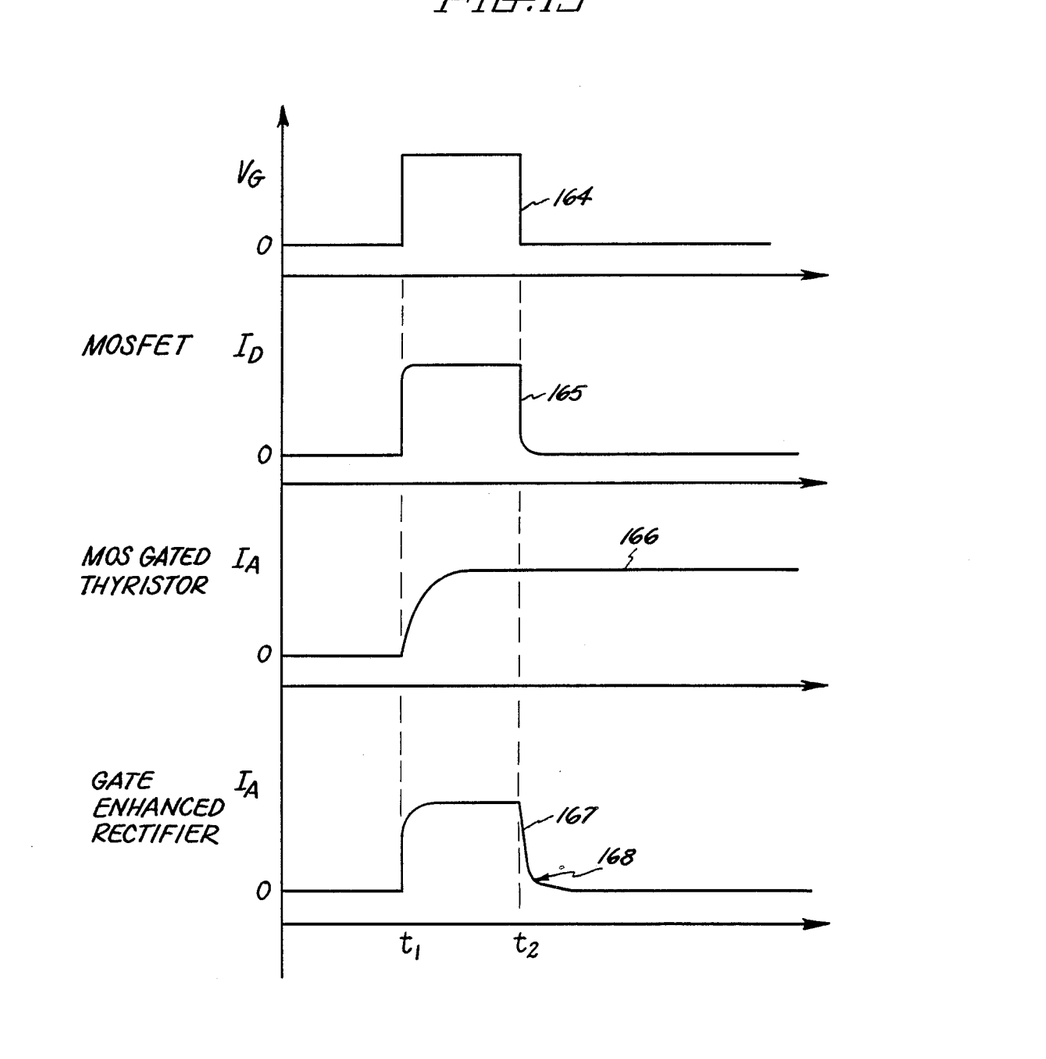
FIG. 15 is a comparative graphical illustration of typical switching wave forms for the prior art devices and the gate controlled rectifier of the instant invention.

A comparison of the switching characteristic of the MOSFET, the MOS gated thyristor and the gate enhanced rectifier can be done with the aid of FIG. 15. In this figure, the gate voltage is turned on at time $t_1$ and turned off at time $t_2$ for all three cases as shown by trace 164. At time $t_2$, the MOSFET turns off rapidly as seen in trace 165 the duration of the turn-off transient being determined by the charging of the gate capacitance. However, the MOS gated thyristor continues to conduct current even after the gate voltage is reduced to zero at time $t_2$ as shown by trace 166, because the current flow is sustained by the internal regenerative mechanism in the devices. In contrast, the gate enhanced rectifier turns off at time $t_2$ as shown by trace 167 because the inversion layer under the gate electrode will cease to exist when the gate voltage is reduced to zero and this will interrupt the current flow path between the anode and cathode terminals. In this case, the minority carriers injected by the anode into the N-base to modulate its conductivity during forward current conduction will be removed by conduction across junction 74 until it becomes reverse biased as shown at point 168. Any remaining minority carriers will then decay by recombination. Consequently, the gate enhanced rectifier turns off at time $t_2$ like the MOSFET but does so more slowly due to the bipolar current conduction. It should be noted that this slower switching speed of the gate enhanced rectifier is adequate for many applications such as motor drives, while its low forward voltage drop when compared with the MOSFET is a major advantage, because it reduces the power dissipated and thus improves the power switching efficiency. Other advantages are better surge current handling capability, higher operating temperature capability and elevated radiation level tolerance made possible by the suppression of regenerative turn-on described above.

It will be appreciated by those skilled in the art that the conductivity types shown in the figures and described above are only illustrative and the polarities of the regions may be reversed without significantly affecting performance. This is especially useful in the construction of complementary devices.

I claim:

1. A gate controlled semiconductor power device for controlling the flow of power to a load comprising:
    a body of semiconductor material including a carrier injection region of one type conductivity, a base region of the opposite type conductivity disposed contiguous to and forming a pn-junction with said carrier injection region, and a first island of said one type conductivity disposed within said base region and spaced from said carrier injection region, said first island and said base region both extending to a first surface of said body of semiconductor material;
    a first power electrode disposed in ohmic contact with said carrier injection region;
    a second power electrode disposed in ohmic contact with said first island and contacting said body only in regions of said one type conductivity; and
    an insulated gate electrode disposed on said first surface adjacent to but electrically insulated from said second power electrode and overlying a portion of said first island which extends from said second power electrode to said base region to control conduction of opposite type conductivity carriers in a channel within said first island extending from said second power electrode to said base region;
    said insulated gate electrode in response to an appropriate gate bias inducing said channel with opposite type conductivity in said first island for conductivity coupling opposite type conductivity carriers from said second power electrode to said opposite type conductivity base region to render said device conductive between said first and second power electrodes and in response to reversal or removal of said gate bias repressing said channel for decoupling said second power electrode and said base region to render said device nonconductive between said first and second power electrodes.

2. The semiconductor power device of claim 1 wherein said second power electrode is disposed directly adjacent said insulated gate electrode and contacts only said first island of said body.

3. The semiconductor power device of claim 1 wherein said base region and said second power electrode are each constructed and arranged to be conductively contiguous with said channel region.

4. The semiconductor power device of claim 1 wherein said body further includes a second island disposed within said base region outside said first island, said second island extending to said first surface adjacent said insulated gate electrode and being of said opposite type conductivity and more heavily doped than the portion of said base region adjacent thereto.

5. The semiconductor device of claim 1 wherein said carrier injection region and said first island comprise semiconductor material of P-type conductivity and said base region comprises semiconductive material of N-conductivity type.

6. A gate controlled semiconductor device comprising:
    a body of semiconductor material and an electrode system;
    said body of semiconductor material including a carrier injection region of one type conductivity, a base region of the opposite type conductivity adjoining said carrier injection region and forming a pn junction therewith, and a first island of said one type conductivity disposed within said base region, forming a pn junction therewith and spaced from said carrier injection region by said base region, said first island extending to a first surface of said body;
    said electrode system consisting of a first electrode, a second electrode, and an insulated gate electrode, said first electrode disposed in ohmic contact with said carrier injection region, said second electrode disposed in ohmic contact with said first island of said body and said insulated gate electrode disposed adjacent to and insulated from said first island and said second electrode;
    said insulated gate electrode comprising a conductor layer with an insulation layer disposed between it and said body and said second electrode and in response to an appropriate bias, inducing a channel of said opposite type conductivity in said first island beneath said insulated gate electrode, said channel conductivity coupling opposite conductivity type carriers from said base region to said second electrode for facilitating opposite type carrier current flow in said body between said first and second electrodes during gate enabled conduction.

7. The semiconductor device of claim 6 wherein said base region and said second electrode are each constructed and arranged to be conductively contiguous with said channel.

8. The semiconductor device of claim 6 wherein said body further includes a second island disposed in said base region outside said first island, said second island extending to said first surface adjacent said insulated gate electrode and being of said opposite type conductivity and more heavily doped than the portion of said base region adjacent thereto.

9. The semiconductor device of claim 6 wherein said base region extends to said first surface and said insulated gate electrode extends along said first surface adjacent to a portion of said base region, said insulated gate electrode and said base region being so constructed and arranged that upon suitable biasing of said insulated gate electrode an accumulation layer of said opposite type conductivity carriers is induced in said base region beneath said insulated gate electrode.

10. The semiconductor device, of claim 6 wherein said carrier injection region and said first island comprise semiconductor material of P-type conductivity and said base region comprises semiconductor material of N-type conductivity.

11. The semiconductor device of claim 6 wherein said second electrode forms an ohmic contact with said body only in areas of said one type conductivity and is directly adjacent to, but electrically insulated from, said insulated gate electrode.

12. A gate controlled semiconductor device comprising:
a body of semiconductor material including a carrier injection region of one type conductivity, a base region of the opposite type conductivity contiguous to and forming a pn junction with said carrier injection region, and a first island of said one type conductivity disposed within said base region and spaced from said carrier injection region;
a first electrode disposed in ohmic contact with said carrier injection region;
a second electrode disposed in ohmic contact with said body only in regions of said one type conductivity and being in ohmic contact with said first island;
said first island and said base region forming a first junction blocking conduction in a first polarity between said first and second electrodes;
said carrier injection region and said base region forming a second junction blocking conduction in an opposite polarity between said first and second power electrodes; and
a gate electrode disposed adjacent to and insulated from said first island between said first junction and said second electrode, said gate electrode establishing, in response to an appropriate gate bias, an opposite type conductivity conductive link for controllably coupling said base region to said second electrode to shunt said second junction and render the device conductive to main bias potentials applied across the first and second electrodes in said first polarity, said gate electrode in response to reversal or removal of said gate bias potential repressing said opposite type conductivity conductive link for controllably decoupling said first and second electrodes to render said device nonconductive to main bias potentials of said first polarity.

13. The semiconductor device of claim 12 wherein:
said body of semiconductor material has first and second opposed major surfaces;
said base region and said first island both extend to said first major surface; and
said carrier injection region extends to said second major surface.

14. The semiconductor device of claim 12 wherein:
said base region spaces said carrier injection region from said first major surface.

15. The semiconductor device of claim 1 wherein:
said carrier injection region extends to a second surface of said body of semiconductor material, said second surface being opposed to said first surface; and
said first electrode is disposed on said second surface.

16. The semiconductor device of claim 15 wherein:
said base region spaces said carrier injection region from said first surface.

17. The semiconductor device of claim 16 wherein:
said second electrode is disposed on said first surface.

18. The semiconductor device of claim 4 wherein said base region spaces said second island from said first island and said charge injection region.

19. The semiconductor device of claim 6 wherein:
said carrier injection region extends to a second surface of said body of semiconductor material, said second surface being opposed to said first surface; and
said first electrode is disposed on said second surface.

20. The semiconductor device of claim 19 wherein:
said base region spaces said carrier injection region from said first surface.

21. The semiconductor device of claim 20 wherein:
said second electrode is disposed on said first surface.

22. The semiconductor device of claim 8 wherein said base region spaces said second island from said first island and said charge injection region.

23. The semiconductor power device of claim 1 wherein said device is capable of carrying an average current density of at least 50 amps/cm$^2$.

24. The semiconductor device of claim 6 wherein said device is capable of carrying a current density of at least 50 amp/cm$^2$.

25. The semiconductor device of claim 12 wherein said device is capable of carrying a current density of at least 50 amps/cm$^2$.

26. A gate controlled semiconductor device comprising:
a body of semiconductors material including a carrier injection region of one type conductivity, a base region of the opposite type conductivity disposed contiguous to and forming a pn-junction with said carrier injection region, and a first island of said one type conductivity disposed within said base region and spaced from said carrier injection region, said first island and said base region both extending to a first surface of said body of semiconductor material;

a first electrode disposed in ohmic contact with said carrier injection region;

a second electrode disposed in ohmic contact with said first island and contacting said body only in regions of said one type conductivity; and an insulated gate electrode disposed on said first surface adjacent to, but electrically insulated from, said second electrode and overlying a portion of said first island which extends from said second electrode to said base region to control conduction of opposite type conductivity carriers in a channel within said first island extending from said second electrode to said base region;

said insulated gate electrode in response to an appropriate gate bias including said channel with opposite type conductivity in said first island for conductivity coupling opposite type conductivity carriers from said second power electrode to said opposite type conductivity base region to render said device conductive between said first and second electrodes and in response to reversal or removal of said gate bias repressing said channel for decoupling said second electrode and said base region to render said device nonconductive between said first and second electrodes.

27. The semiconductor device of claim 26 wherein said second electrode is disposed directly adjacent said insulated gate electrode and contacts only said first island of said body.

28. The semiconductor device of claim 26 wherein said base region and said second electrode are each constructed and arranged to be conductively contiguous with said channel region.

29. The semiconductor device of claim 26 wherein said body further includes a second island disposed within said base region outside said first island, said second island extending to said first surface adjacent said insulated gate electrode and being of said opposite type conductivity and more heavily doped than the portion of said base region adjacent thereto.

30. The semiconductor device of claim 26 wherein said device is capable of carrying an average current density of at least 50 amps/cm$^2$.

* * * * *